(12) United States Patent
Biskeborn et al.

(10) Patent No.: US 10,176,831 B2
(45) Date of Patent: Jan. 8, 2019

(54) TUNNEL VALVE READ SENSOR WITH CRYSTALLINE ALUMINA TUNNEL BARRIER DEPOSITED USING ROOM TEMPERATURE TECHNIQUES

(71) Applicant: International Business Machines Corporation, Armonk, NY (US)

(72) Inventors: Robert G. Biskeborn, Hollister, CA (US); Calvin S. Lo, Saratoga, CA (US); Teya Topuria, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/676,688

(22) Filed: Aug. 14, 2017

(65) Prior Publication Data

US 2017/0372731 A1    Dec. 28, 2017

Related U.S. Application Data

(62) Division of application No. 14/961,781, filed on Dec. 7, 2015, now Pat. No. 9,747,930.

(51) Int. Cl.
| | |
|---|---|
| *G11B 5/39* | (2006.01) |
| *C23C 14/08* | (2006.01) |
| *C23C 14/02* | (2006.01) |
| *G11B 5/008* | (2006.01) |
| *G11B 5/31* | (2006.01) |
| *C23C 14/34* | (2006.01) |
| *G11B 5/127* | (2006.01) |
| *G11B 5/41* | (2006.01) |
| *G11B 15/46* | (2006.01) |

(Continued)

(52) U.S. Cl.
CPC .......... *G11B 5/3909* (2013.01); *C23C 14/021* (2013.01); *C23C 14/022* (2013.01); *C23C 14/081* (2013.01); *C23C 14/34* (2013.01); *G11B 5/00813* (2013.01); *G11B 5/00826* (2013.01); *G11B 5/1272* (2013.01); *G11B 5/3163* (2013.01); *G11B 5/41* (2013.01); *G11B 15/46* (2013.01); *H01L 43/02* (2013.01); *H01L 43/08* (2013.01); *G11B 2005/3996* (2013.01)

(58) Field of Classification Search
None
See application file for complete search history.

(56) References Cited

U.S. PATENT DOCUMENTS

| | | |
|---|---|---|
| 8,526,137 B2 | 9/2013 | Biskeborn et al. |
| 9,747,930 B2 | 8/2017 | Biskeborn et al. |
| 2006/0039082 A1 | 2/2006 | Biskeborn et al. |

(Continued)

FOREIGN PATENT DOCUMENTS

JP    2003273421 A    9/2003

OTHER PUBLICATIONS

Biskeborn et al., U.S. Appl. No. 14/961,781, filed Dec. 7, 2015.

(Continued)

*Primary Examiner* — William J Klimowicz
(74) *Attorney, Agent, or Firm* — Zilka-Kotab, P.C.

(57) ABSTRACT

In one general embodiment, a method includes forming a first magnetic layer, forming a tunnel barrier layer above the first magnetic layer, and forming a second magnetic layer above the tunnel barrier layer. The tunnel barrier layer includes crystalline alumina. The tunnel barrier layer is formed at a temperature of less than 100 degrees centigrade.

3 Claims, 11 Drawing Sheets

(51) Int. Cl.
*H01L 43/02* (2006.01)
*H01L 43/08* (2006.01)

(56) References Cited

U.S. PATENT DOCUMENTS

| | | |
|---|---|---|
| 2008/0217710 A1 | 9/2008 | Horng et al. |
| 2009/0128167 A1 | 5/2009 | Hamada et al. |
| 2009/0243008 A1* | 10/2009 | Kitagawa ............... H01L 27/222 257/421 |
| 2010/0053817 A1* | 3/2010 | Biskeborn ............... B82Y 10/00 360/313 |
| 2010/0183902 A1* | 7/2010 | Kim ....................... B82Y 25/00 428/811.1 |
| 2012/0257298 A1 | 10/2012 | Sato et al. |
| 2013/0221461 A1 | 8/2013 | Sukegawa et al. |
| 2014/0087089 A1 | 3/2014 | Biskeborn et al. |
| 2015/0103446 A1 | 4/2015 | Biskeborn et al. |
| 2017/0162217 A1 | 6/2017 | Biskeborn et al. |

OTHER PUBLICATIONS

Restriction Requirement from U.S. Appl. No. 14/961,781, dated Oct. 11, 2016.
Non-Final Office Action from U.S. Appl. No. 14/961,781, dated Oct. 31, 2016.
Oleinik et al., "Structural and electronic properties of Co/Al2O3/Co magnetic tunnel junction from first principles," The American Physical Society, Physical Review B, vol. 62, No. 6, Aug. 2000, pp. 3952-3959.
Final Office Action from U.S. Appl. No. 14/961,781, dated Feb. 21, 2017.
Notice of Allowance from U.S. Appl. No. 14/961,781, dated Apr. 21, 2017.

* cited by examiner

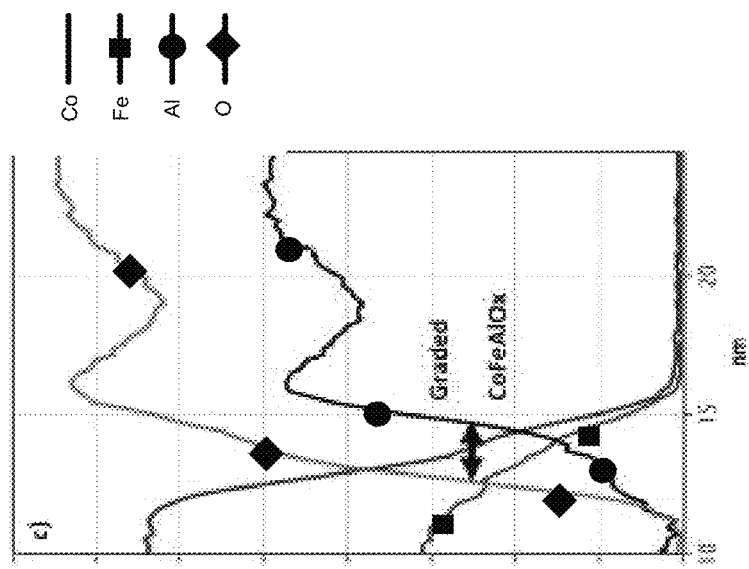
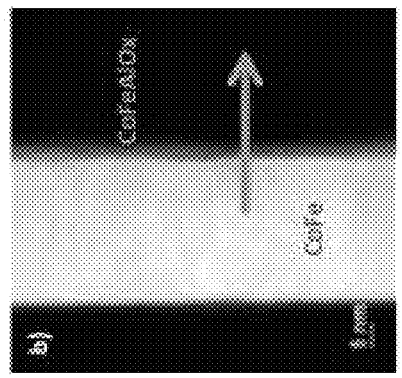
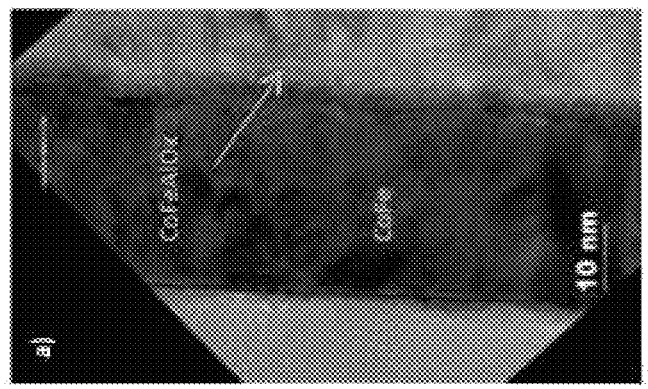
FIG. 11C
FIG. 11B
FIG. 11A

TUNNEL VALVE READ SENSOR WITH CRYSTALLINE ALUMINA TUNNEL BARRIER DEPOSITED USING ROOM TEMPERATURE TECHNIQUES

BACKGROUND

The present invention relates to data storage systems, and more particularly, this invention relates to a magnetic head with a tunnel valve sensor having a crystalline alumina barrier layer.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, the drive moves the magnetic tape over the surface of the tape head at high speed. Usually the tape head is designed to minimize the spacing between the head and the tape. The spacing between the magnetic head and the magnetic tape is crucial and so goals in these systems are to have the recording gaps of the transducers, which are the source of the magnetic recording flux in near contact with the tape to effect writing sharp transitions, and to have the read elements in near contact with the tape to provide effective coupling of the magnetic field from the tape to the read elements.

SUMMARY

A method according to one embodiment includes forming a first magnetic layer, forming a tunnel barrier layer above the first magnetic layer, and forming a second magnetic layer above the tunnel barrier layer. The tunnel barrier layer includes crystalline alumina. The tunnel barrier layer is formed at a temperature of less than 100 degrees centigrade.

An apparatus, according to another embodiment, includes an array of magnetic tunnel junction devices arranged along a tape bearing surface of a magnetic tape head module, each magnetic tunnel junction device having a reference layer, a free layer, and a tunnel barrier layer between the free and reference layers. The tunnel barrier layer of each magnetic tunnel junction device is primarily crystalline alumina. In addition, each tunnel barrier layer has a physical gradient in a degree of crystallinity that increases from a bottom to a top thereof, with the highest degree of crystallinity being at the top of the tunnel barrier layer.

An apparatus according to yet another embodiment includes an array of magnetic tunnel junction devices arranged along a tape bearing surface of a magnetic tape head module, each magnetic tunnel junction device having a reference layer, a free layer, and a tunnel barrier layer between the free and reference layers, where the tunnel barrier layer is primarily crystalline alumina. In addition, an upper surface of the free layer or reference layer under each tunnel barrier layer has physical characteristics of being cleaned at a milling angle of between 40 and 80 degrees for a duration sufficient to remove an amorphous native oxide sublayer therefrom. Moreover, the physical characteristics include absence of a metal oxide along the upper surface having an oxygen to metal ratio in the metal oxide that is outside an approximately stoichiometric ratio.

Various embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 11A is a magnified view of a graded $CoFeAlO_x$ transition layer, according to one embodiment.

FIG. 11B is a Z-contrast image of the structure in FIG. 11A.

FIG. 11C is an electron energy loss spectroscopy (EELS) scan across the interface shown in FIGS. 11A and 11B.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof. Various embodiments include a magnetic head with a tunnel valve sensor having a crystalline alumina barrier layer.

In one general embodiment, a method includes forming a first magnetic layer, forming a tunnel barrier layer above the first magnetic layer, and forming a second magnetic layer above the tunnel barrier layer. The tunnel barrier layer includes crystalline alumina. The tunnel barrier layer is formed at a temperature of less than 100 degrees centigrade.

In another general embodiment, an apparatus includes an array of magnetic tunnel junction devices arranged along a tape bearing surface of a magnetic tape head module, each magnetic tunnel junction device having a reference layer, a free layer, and a tunnel barrier layer between the free and reference layers. The tunnel barrier layer of each magnetic tunnel junction device is primarily crystalline alumina. In addition, each tunnel barrier layer has a physical gradient in a degree of crystallinity that increases from a bottom to a top thereof, with the highest degree of crystallinity being at the top of the tunnel barrier layer.

In yet another general embodiment, an apparatus includes an array of magnetic tunnel junction devices arranged along a tape bearing surface of a magnetic tape head module, each magnetic tunnel junction device having a reference layer, a free layer, and a tunnel barrier layer between the free and reference layers, where the tunnel barrier layer is primarily crystalline alumina. In addition, an upper surface of the free layer or reference layer under each tunnel barrier layer has physical characteristics of being cleaned at a milling angle of between 40 and 80 degrees for a duration sufficient to remove an amorphous native oxide sublayer therefrom. Moreover, the physical characteristics include absence of a metal oxide along the upper surface having an oxygen to metal ratio in the metal oxide that is outside an approximately stoichiometric ratio.

Figure 1A:
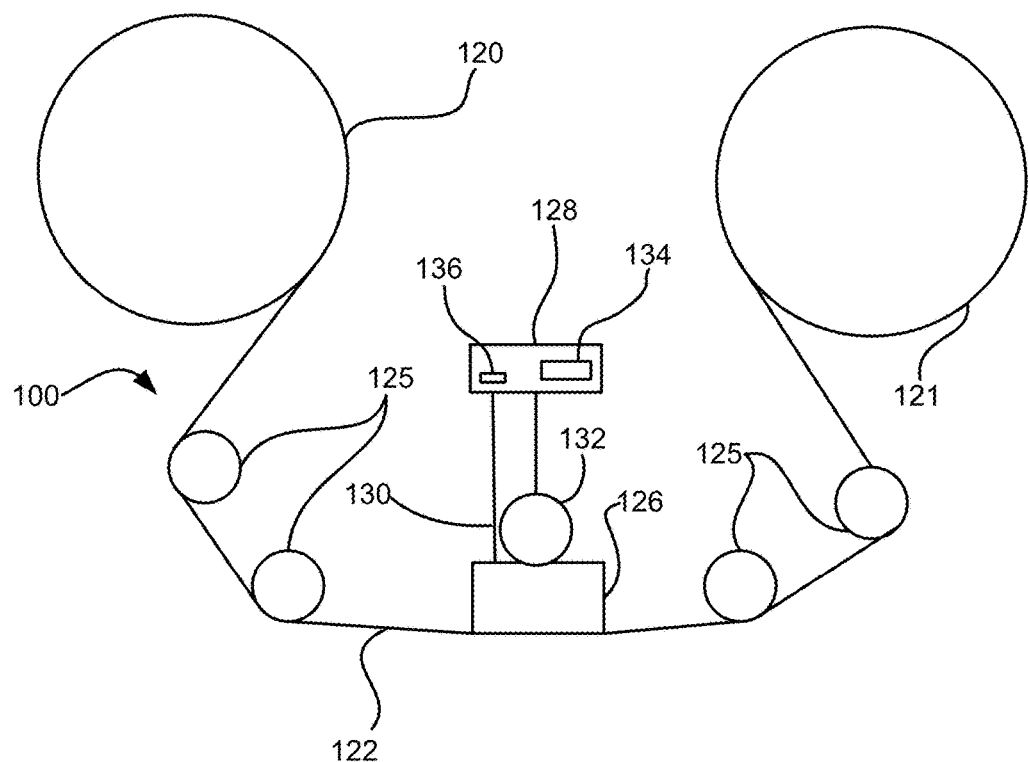
FIG. 1A is a schematic diagram of a simplified tape drive system according to one embodiment.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
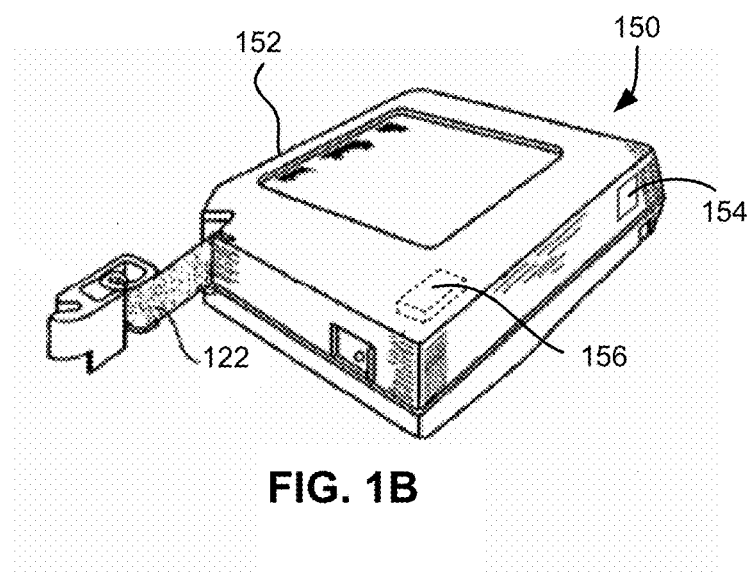
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 2:
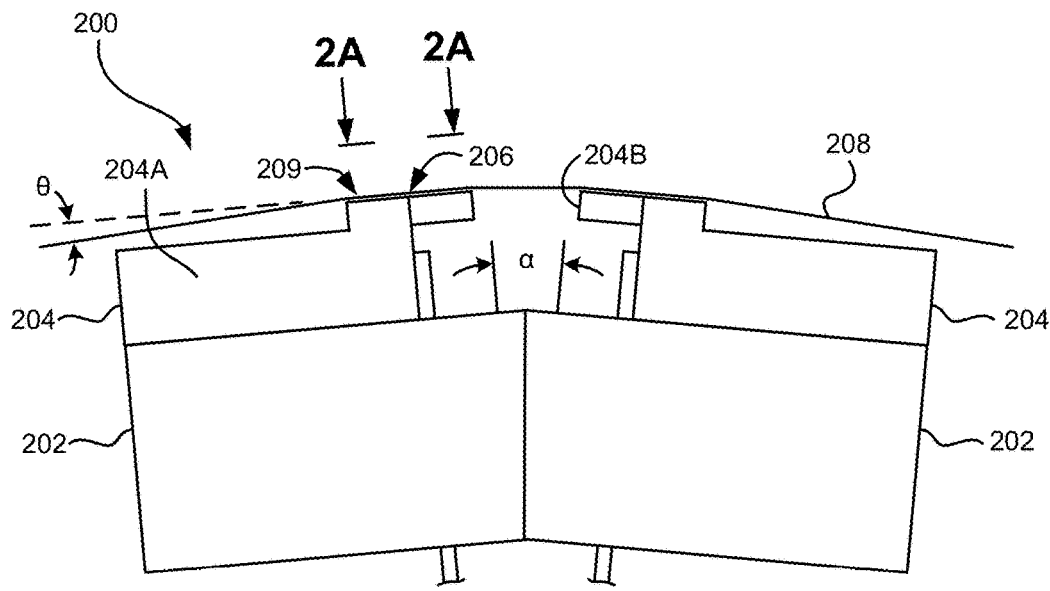
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2A:
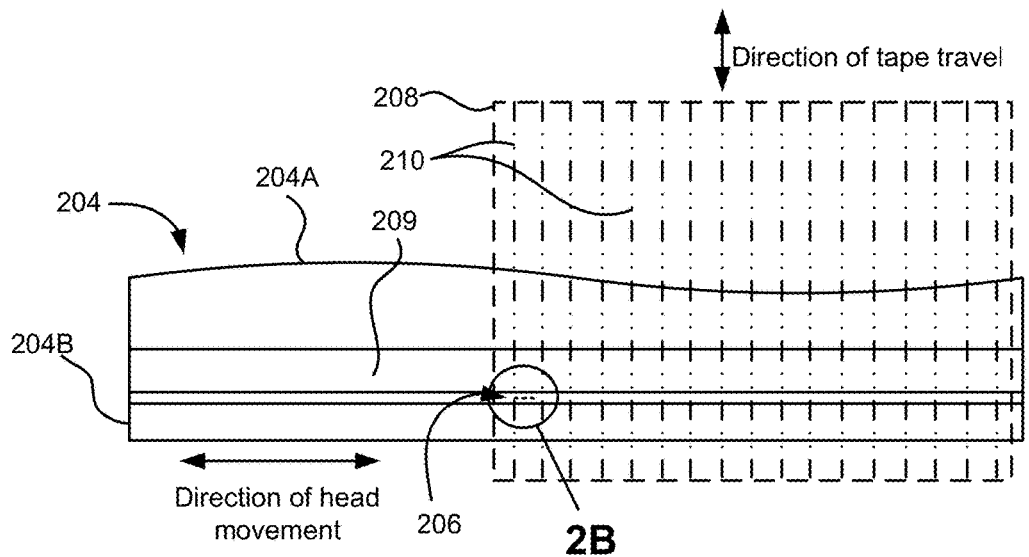
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2A on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2B:
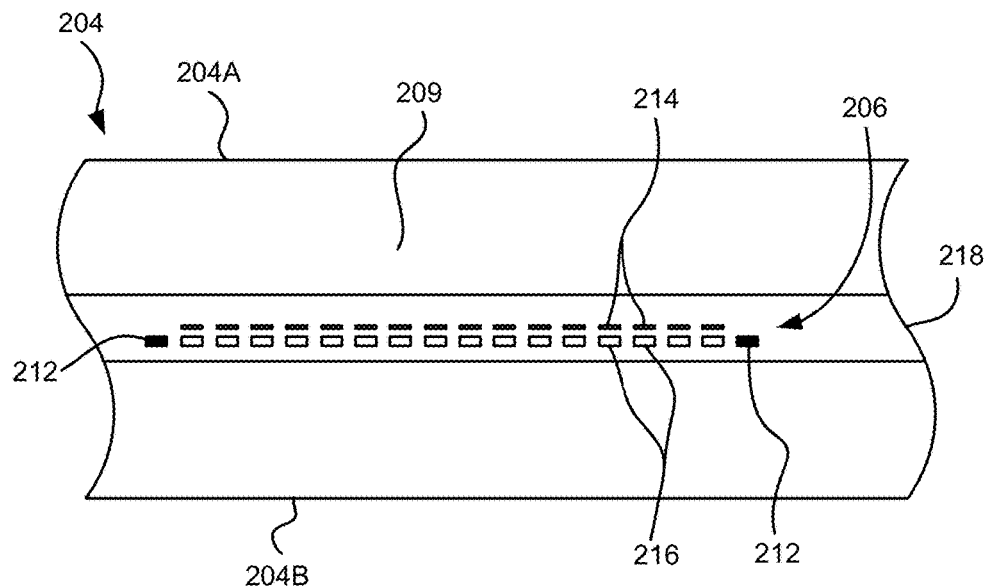
FIG. 2B is a detailed view taken from Circle 2B of FIG. 2A.

FIG. 2B depicts a plurality of readers and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. As noted by considering FIGS. 2 and 2A-B together, each module 204 may include a complementary set of readers and/or writers 206 for such things as bi-directional reading and writing, read-while-write capability, backward compatibility, etc.

Figure 2C:
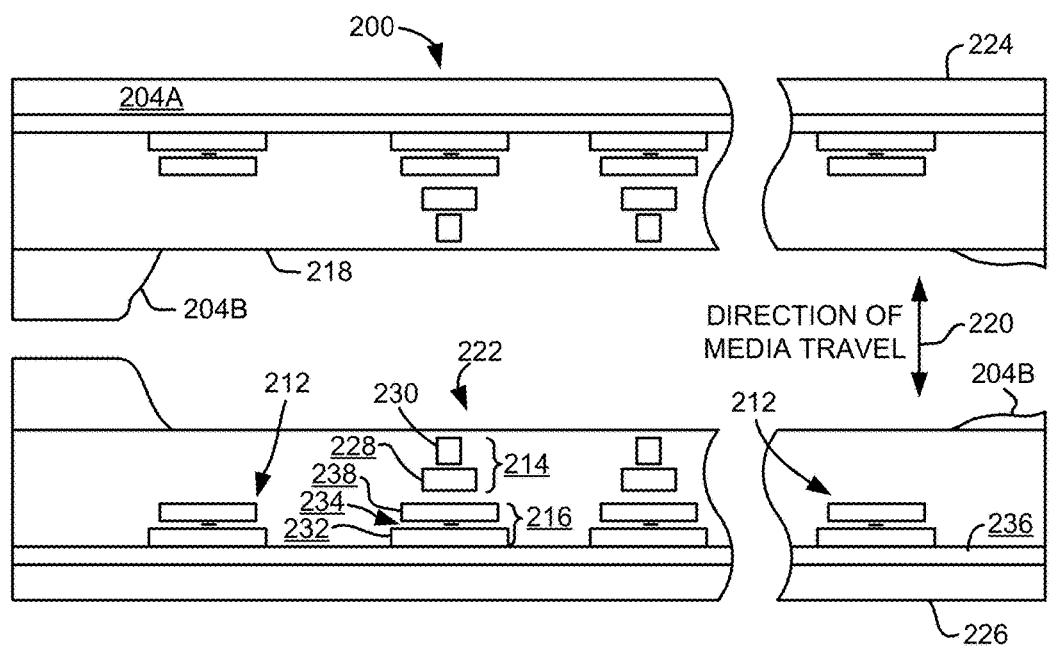
FIG. 2C is a detailed view of a partial tape bearing surface of a pair of modules.

FIG. 2C shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (—), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, tunneling magnetoresistance (TMR), etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 4:
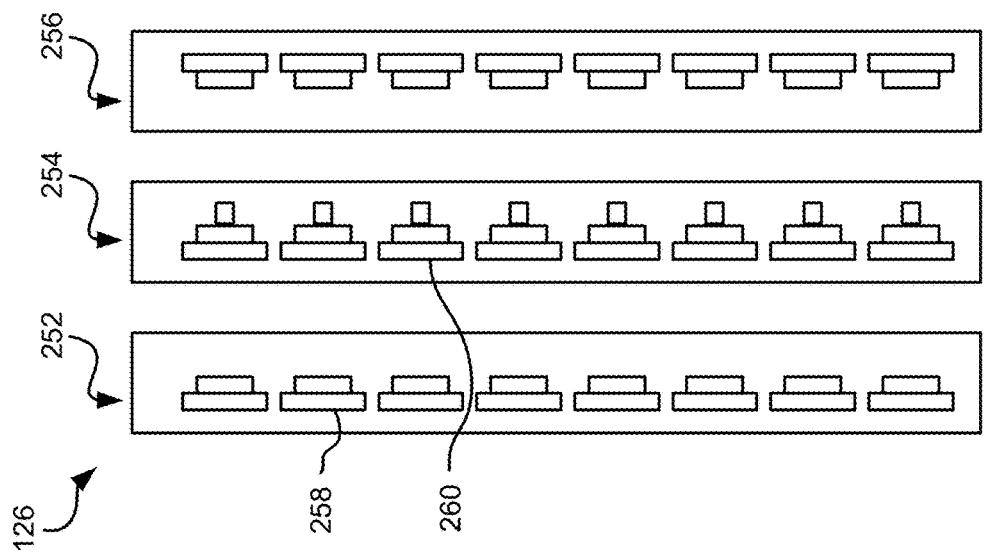
FIG. 4 is a partial tape bearing surface view of a magnetic head having a read-write-read configuration.
Figure 3:
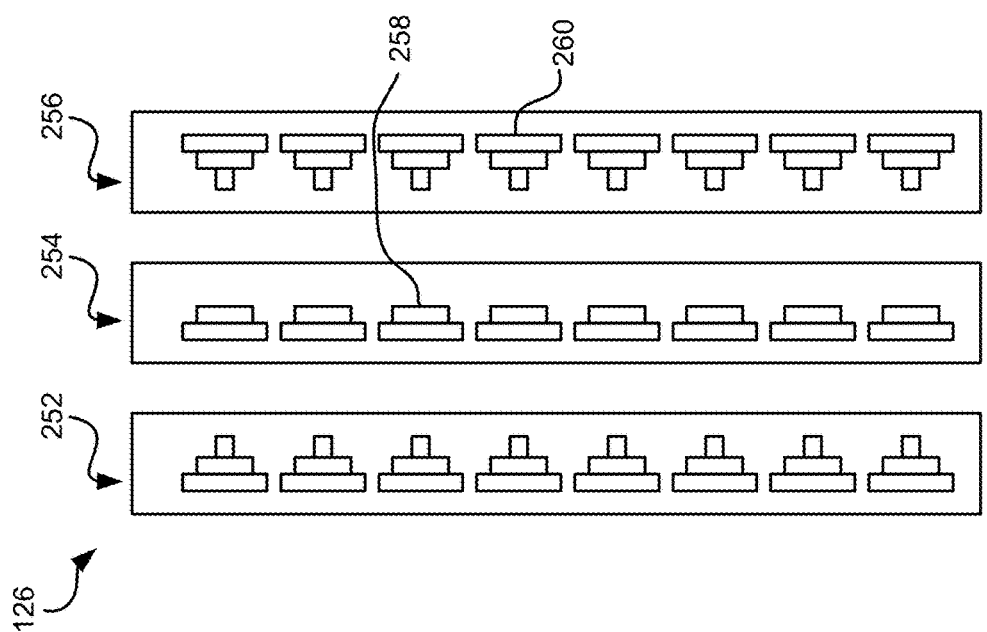
FIG. 3 is a partial tape bearing surface view of a magnetic head having a write-read-write configuration.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
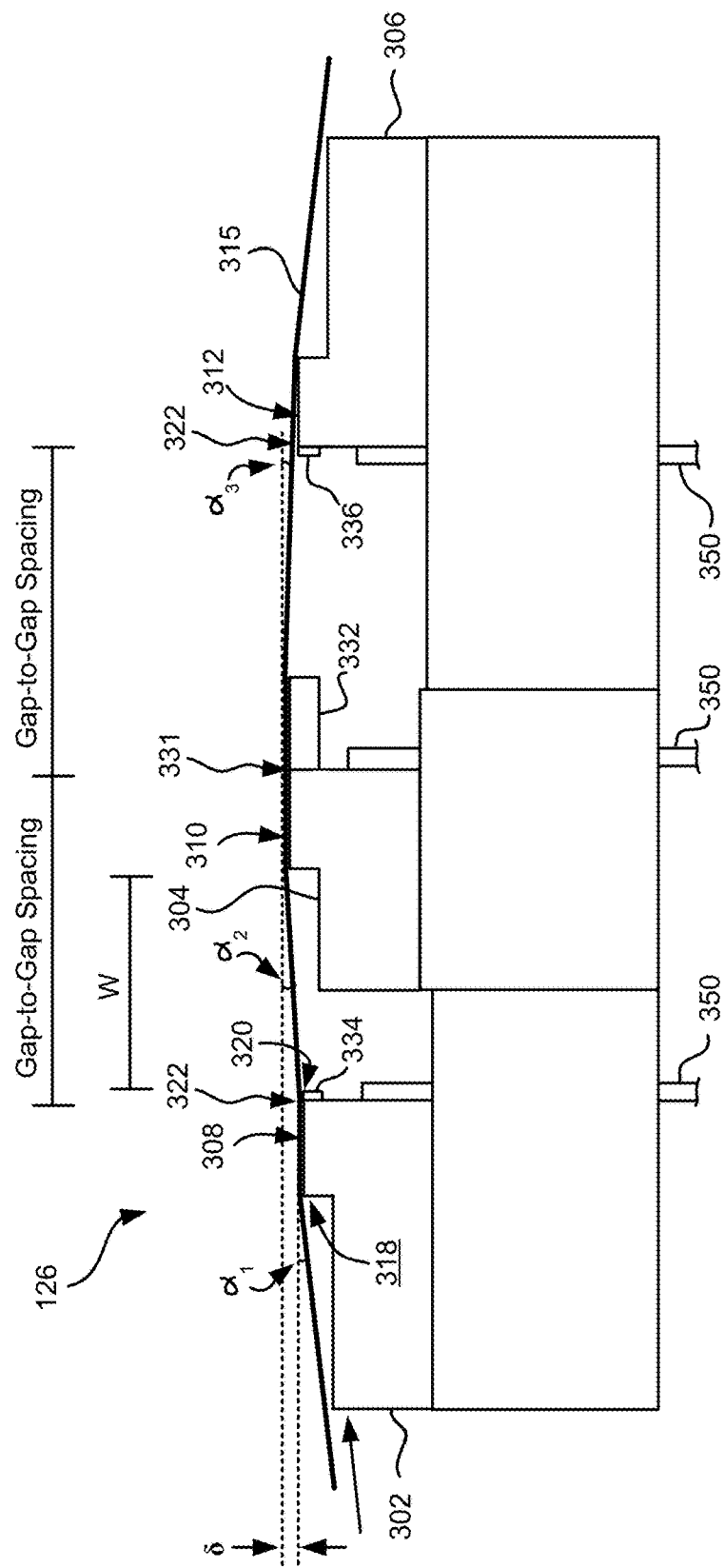
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
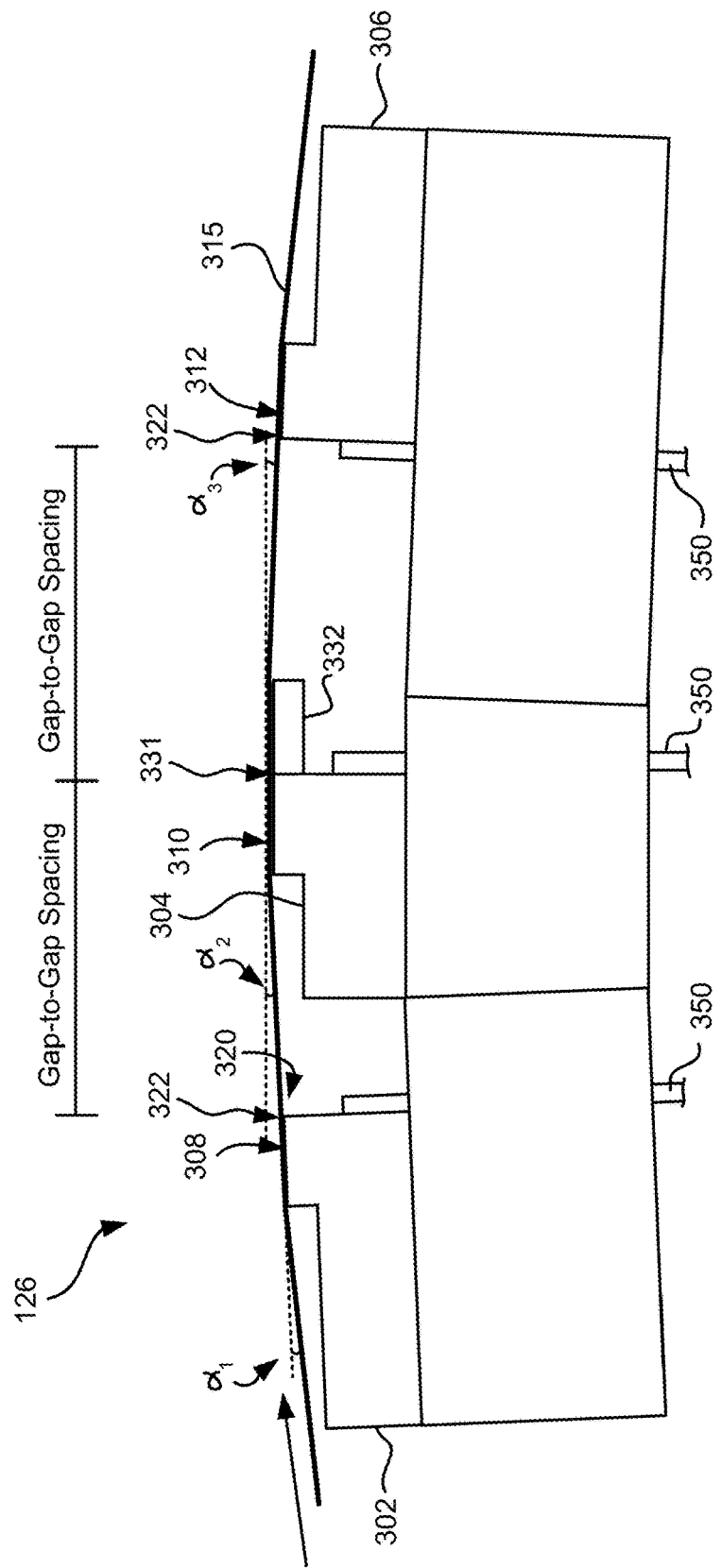
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used LTO tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
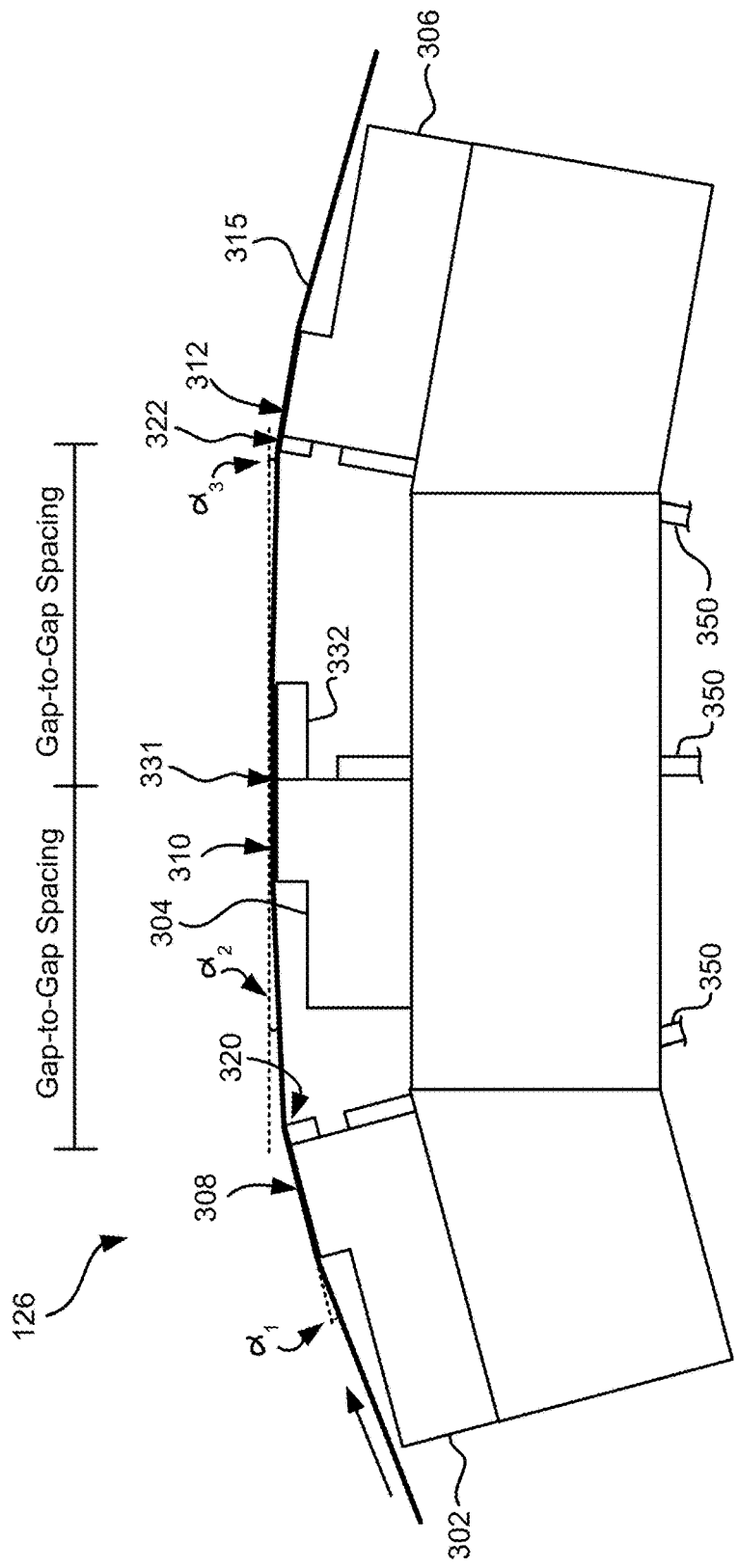
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

In an effort to improve data density in magnetic tape recording, magnetic tunnel valve read sensors are being investigated due to their increased magnetic sensitivity. Particularly, tunnel valve read sensors using MgO tunnel barrier layers have been considered. MgO produces a large magnetoresistive (MR) effect (deltaR/R), which is several-fold larger than in GMR structures. MgO provides an MR effect of approximately 110 to 220%. However, MgO tunnel barrier layers have been found to be susceptible to dissolution in the presence of water. This is important for some applications, such as magnetic tape recording, where sensors may be exposed to humidity in the environment. Dissolution of the tunnel barrier layer may affect resistance across the tunnel junction and in general may degrade tunneling, which in turn reduces signal, and can even render the head inoperable.

Tunnel junction devices having amorphous barriers of AlOx and TiOx have been used. However, their MR effect of only up to about 70% is significantly lower than MgO (up to 220%), and therefore were replaced by MgO.

Various embodiments described herein implement crystalline alumina in the tunnel barrier layer, because the crystalline alumina is less susceptible to dissolution in aqueous environments than MgO. Moreover, using the teachings found herein, the crystalline alumina can be formed at temperatures suitable for magnetic head processing.

Previous methods used for producing hard alumina generally require temperatures that exceed normal head processing temperatures, which can be as low as about 200° C. to about 250° C. Thus, producing hard alumina films and layers in a magnetic head using such prior methods damages the devices of the head, such as read transducers and write transducers.

Figure 8:
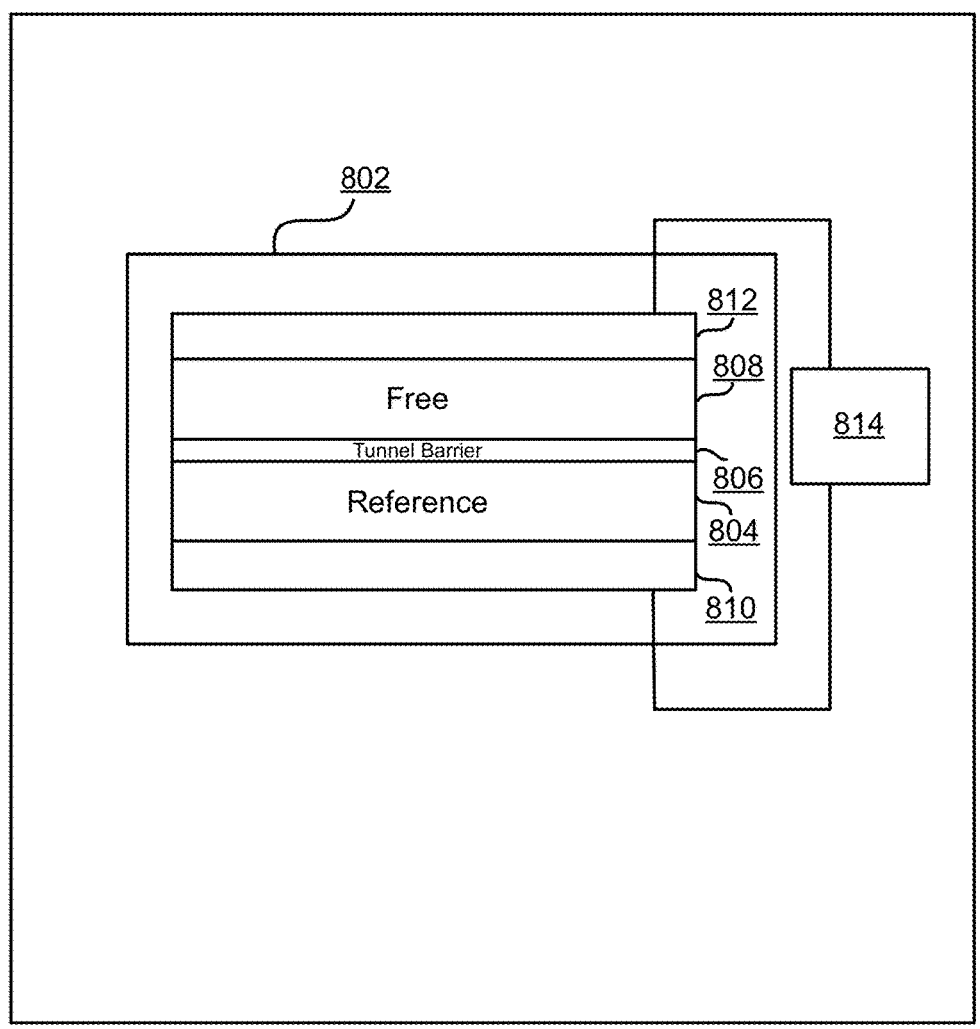
FIG. 8 is a system diagram of an apparatus according to one embodiment.

FIG. 8 depicts an apparatus 800, in accordance with one embodiment. As an option, the present apparatus 800 may be implemented in conjunction with features from any other embodiment listed herein, such as those described with reference to the other FIGS. Of course, however, such apparatus 800 and others presented herein may be used in various applications and/or in permutations which may or may not be specifically described in the illustrative embodiments listed herein. Further, the apparatus 800 presented herein may be used in any desired environment.

The apparatus 800 includes a magnetic tunnel junction device 802 having a reference layer 804, a free layer 808, and a tunnel barrier layer 806 therebetween, the tunnel barrier layer 806 comprising crystalline alumina.

In one embodiment, the apparatus may include a magnetic read sensor, where the magnetic tunnel junction device is a portion of the magnetic read sensor. For example, the magnetic read sensor may be part of a magnetic head, e.g., a tape head as shown in FIGS. 1A, 2, and 5-7.

In some embodiments, only one magnetic tunnel junction device 802 is present in the apparatus. In other embodiments, a plurality of the magnetic tunnel junction devices may be present in the apparatus. For example, an array of magnetic tunnel junction devices 802 may be present on a common substrate. For example, in magnetic head, the array may be a linear array of read sensors on a common substrate, which together are part of a module of a magnetic tape head. See, e.g., the array or readers 216 of FIG. 2B.

The apparatus may be a tape drive, e.g., as shown in FIG. 1A, thereby including a drive mechanism for passing a magnetic recording tape over the magnetic tunnel junction device, and a controller electrically coupled to the magnetic tunnel junction device.

In another embodiment, the magnetic tunnel junction device is a portion of a magnetic random access memory device, e.g., of conventional construction except for having the tunnel barrier layer(s) of crystalline alumina.

With continued reference to FIG. 8, the reference layer 804 may be of a magnetic material such as CoFe, CoFeB, etc., or any other suitable magnetic material, as would be apparent to one skilled in the art upon reading the present disclosure. The free layer may be comprised of films of CoFe(B), CoFe, NiFe, etc. The reference layer 804 and free layer 808 may be formed using known techniques. Moreover, while the reference layer 804 is shown formed below the tunnel barrier layer 806, it may also equivalently be formed above the tunnel barrier layer 806.

The tunnel barrier layer 806 is primarily crystalline alumina, i.e., alumina that is at least partially poly-crystalline such that the density increase due to crystallinity is at least 30% greater than purely amorphous alumina of the same chemical composition and approximate thickness. Ideally, the tunnel barrier layer 806 is fully crystalline.

With continued reference to FIG. 8, preferably, electrodes 810, 812 of conventional construction may be provided to enable passage of a current through the magnetic tunnel junction device 802. In some embodiments, the electrodes may be in electrical communication with a circuit 814 that processes a signal from the magnetic tunnel junction device 802, such signal being derived from a current passing through the magnetic tunnel junction device 802 from one electrode to the other in a direction perpendicular to the plane of deposition of the tunnel barrier layer 806. Examples of such a circuit 814 include a read channel where the magnetic tunnel junction device 802 is part of a read sensor, a controller where the magnetic tunnel junction device 802 is part of a magnetic random access memory device, etc.

Figure 9:
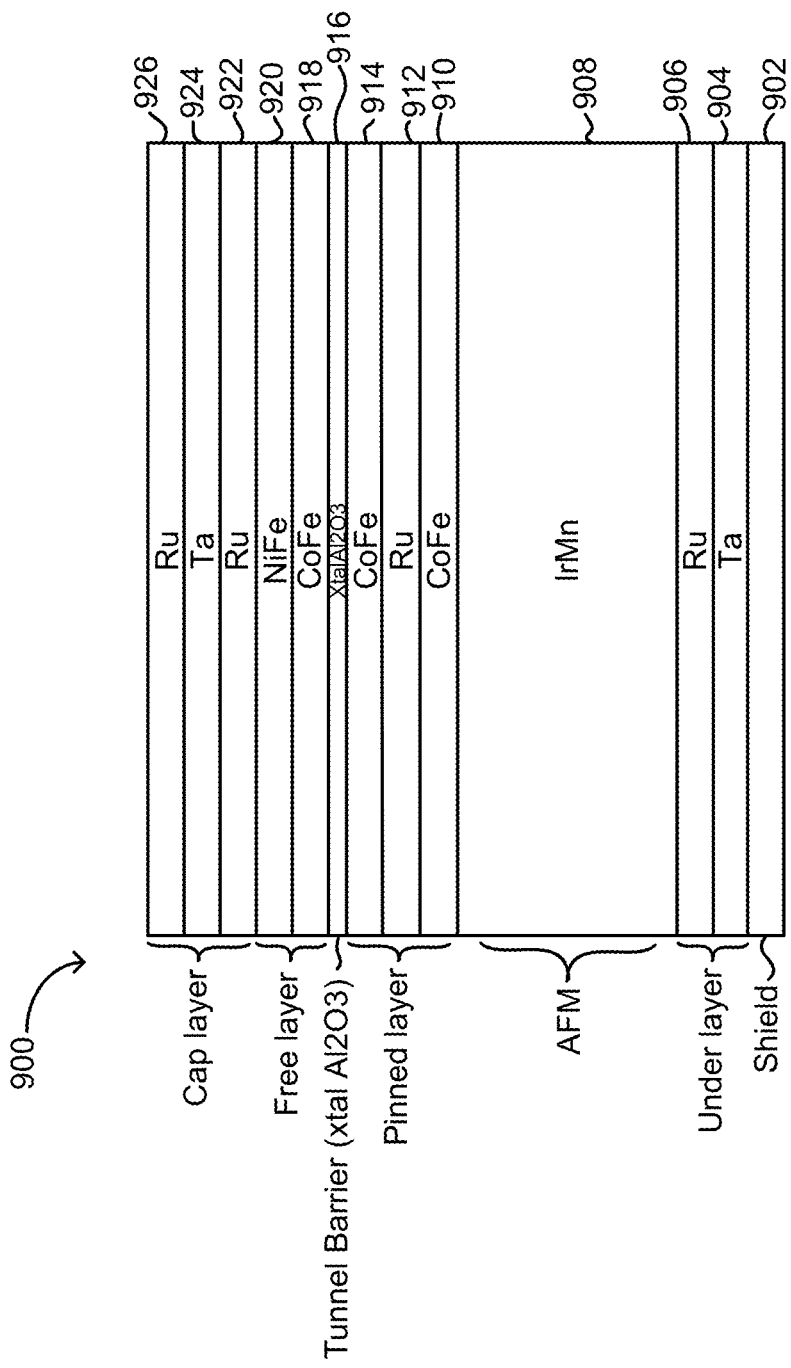
FIG. 9 is a depiction of a tunneling magnetoresistive read sensor structure according to one exemplary embodiment.

FIG. 9 illustrates an exemplary structure 900 for a tunneling magnetoresistive read sensor according to one exemplary embodiment. As an option, the present structure 900 may be implemented in conjunction with features from any other embodiment listed herein, such as those described with reference to the other FIGS. Of course, however, such structure 900 and others presented herein may be used in various applications and/or in permutations which may or may not be specifically described in the illustrative embodiments listed herein. Further, the structure 900 presented herein may be used in any desired environment.

The structure 900 of FIG. 9 is formed from the bottom upward, starting with Ta and Ru underlayers 904, 906 formed on a substrate such as a lower magnetic shield 902. An antiferromagnetic layer 908 is formed thereover, followed by an antiparallel pinned layer structure having CoFe layers 910, 914 separated by a thin, e.g., approximately 4 or 8 angstrom thick antiparallel coupling layer 912 of Ru. A tunnel barrier layer 916 of crystalline alumina is formed above the pinned layer structure. A bi-layer free layer having CoFe and NiFe layers 918, 920 is formed above the tunnel barrier layer 916. A cap layer of Ru, Ta and Ru layers 922, 924, 926 are formed above the free layer.

Figure 10:
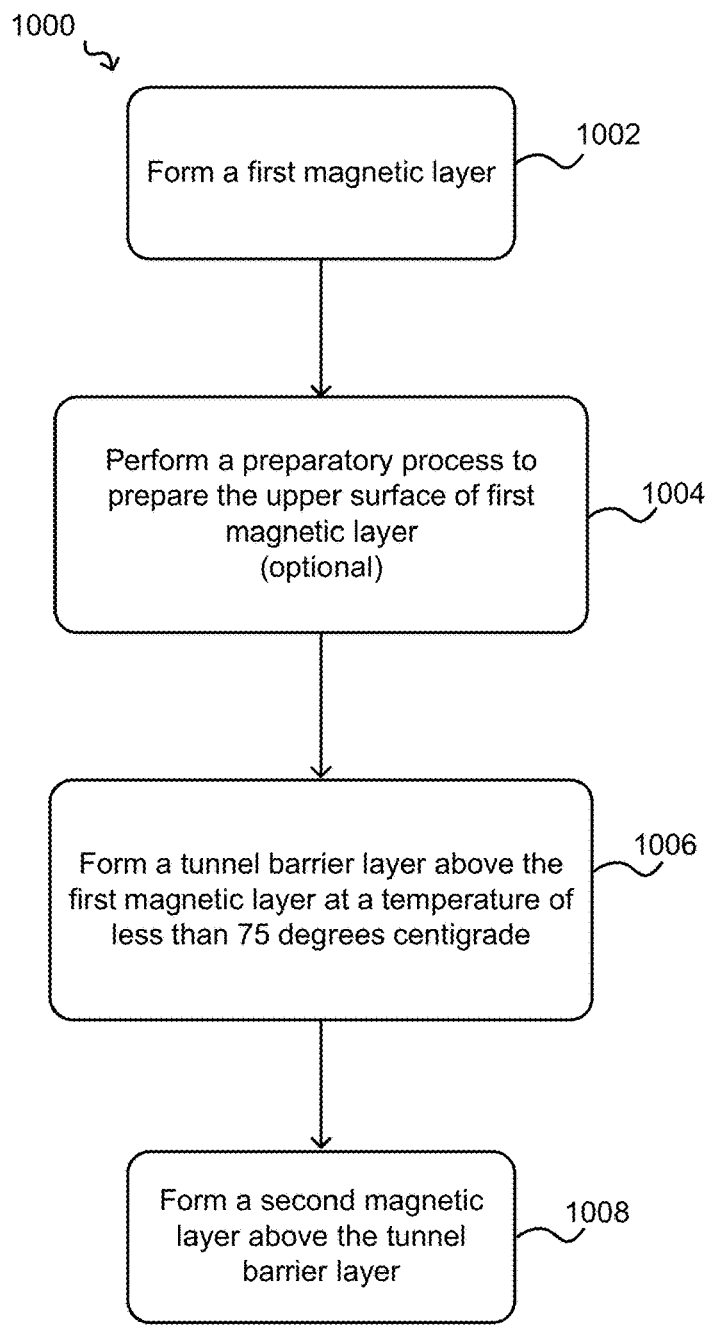
FIG. 10 is a flow diagram of a method for forming a magnetic tunnel junction structure according to one embodiment.

Now referring to FIG. 10, a flowchart of a method 1000 is shown according to one embodiment. The method 1000 may be used to create any of the various embodiments depicted in FIGS. 1-9, among others, in various embodiments. Of course, more or less operations than those specifically described in FIG. 10 may be included in method 1000, as would be understood by one of skill in the art upon reading the present descriptions.

Each of the steps of the method 1000 may be performed using known techniques according to the teachings herein.

As shown in FIG. 10, method 1000 includes forming a first magnetic layer in step 1002. The first magnetic layer may be a reference layer, a free layer, etc.

In optional step 1004, a preparatory process may be performed to prepare the upper surface of the first magnetic layer for formation of the tunnel barrier layer thereon. The upper surface of the first magnetic layer is cleaned by milling, e.g., sputter cleaning, bombarding with ionized argon, etc. the upper surface of the first magnetic layer at an angle of between 40 and 80 degrees from normal to the upper surface, preferably at an angle of about 60 degrees. Moreover, a duration of the cleaning is preferably sufficient to remove an amorphous native oxide sublayer of the first magnetic layer, e.g., an amorphous $CoFeO_x$ layer where x in this and other layers represents a potential deviation from an approximately stoichiometric ratio, which can degrade the adhesion of the overlying layer. As general guidance, the upper surface of the first magnetic layer should be substantially free of the amorphous native oxide sublayer after the milling. In general, the cleaning step may take approximately 10 seconds. An oxygen plasma may then be applied for at least one of removing carbonaceous contaminants and oxidizing the upper surface of the first magnetic layer, e.g., to reoxidize reduced metal oxides. The sputtering energy during the milling may be in a range of about 250 to about 500 eV. Where the first magnetic layer is CoFe, for example, reoxidation is exothermic and promotes CoFe-oxide recrystallization on the underlying CoFe grains. Newly formed oxide crystallites act as template for subsequent alumina coating crystallization. The cleaning promotes formation of a graded transition layer between the first magnetic layer and the subsequently-formed crystalline alumina layer thereabove.

FIG. 11A is a magnified view of a properly formed, graded, $CoFeAlO_x$ transition layer, with substantially no amorphous $CoFeO_x$ at the CoFe interface. The composition of the graded $CoFeAlO_x$ transition layer thus transitions from a higher CoFe content at the left side to a higher alumina content on the right side in the direction of the arrow of FIG. 11B, which is a Z-contrast image of the structure in FIG. 11A with the spectral scan direction being indicated by the arrow. FIG. 11C is an electron energy loss spectroscopy (EELS) scan across the layer interface shown in FIGS. 11A and 11B. The EELS scan shows the presence of the graded interface. The alumina layer formed on the CoFe layer exhibited a high degree of crystallinity.

Referring to step 1006 of FIG. 10, a tunnel barrier layer is formed above the first magnetic layer. Various formation methods may be used. The tunnel barrier layer is formed at a temperature of less than 100 degrees centigrade, preferably less than about 50 degrees centigrade, and ideally at room temperature (in a range of 20-50 degrees centigrade).

In a first approach, an amorphous alumina layer is formed. Then, the amorphous alumina layer is irradiated to convert the amorphous alumina to crystalline alumina. Illustrative low temperature processes that may be adapted for forming an amorphous alumina tunnel barrier layer according to the teachings herein are presented in US Patent Appl. Pub. No. 2014-0087089 A1 to Biskeborn et al., which is herein incorporated by reference.

Formation of the tunnel barrier layer may result in a physical gradient in the degree of crystallinity that increases from a bottom to a top thereof, with the highest degree of crystallinity being at the top of the layer, which receives the highest amount of exposure. The degree of crystallinity refers to the fraction of alumina that is crystalline. The bottom is the lowermost layer deposited during formation of the tunnel barrier layer. Moreover, a quality of the crystallinity of the alumina may increase from a bottom to a top thereof. The quality of the crystallinity refers to the degree of crystallographic orientation. The highest degree of crystallographic orientation is 100% of highly aligned purely crystalline alumina. Post exposure thermal anneal may be used to promote uniformity of crystallinity throughout the barrier layer.

In another approach, the tunnel barrier layer may be formed using the low-temperature processes disclosed in U.S. Pat. No. 8,526,137 to Biskeborn et al., which is herein incorporated by reference.

In another approach, forming the tunnel barrier layer includes sputter depositing (sputtering) aluminum under conditions that result in deposition of crystalline alumina. The sputtering is performed using an aluminum target, and oxygen is added during the sputtering.

In another approach, forming the tunnel barrier layer includes sputter depositing alumina from an alumina target under conditions that result in deposition of crystalline alumina.

Referring again to FIG. 10, step 1008 includes forming a second magnetic layer above the tunnel barrier layer. As in step 1002, known techniques may be used to form the second magnetic layer.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An apparatus, comprising:
an array of magnetic tunnel junction devices arranged along a tape bearing surface of a magnetic tape head module, each magnetic tunnel junction device having a reference layer, a free layer, and a tunnel barrier layer between the free and reference layers,
wherein the tunnel barrier layer of each magnetic tunnel junction device is primarily crystalline alumina,
wherein each tunnel barrier layer has a physical gradient in a degree of crystallinity that increases from a bottom to a top thereof, with the highest degree of crystallinity being at the top of the tunnel barrier layer,
wherein substantially no amorphous native oxide sublayer is present between each tunnel barrier layer and a layer immediately thereunder.

2. An apparatus, comprising:
an array of magnetic tunnel junction devices arranged along a tape bearing surface of a magnetic tape head module, each magnetic tunnel junction device having a reference layer, a free layer, and a tunnel barrier layer between the free and reference layers,
wherein the tunnel barrier layer of each magnetic tunnel junction device is primarily crystalline alumina,
wherein each tunnel barrier layer has a physical gradient in a degree of crystallinity that increases from a bottom to a top thereof, with the highest degree of crystallinity being at the top of the tunnel barrier layer,
wherein the tunnel barrier layer is formed on the reference layer, the reference layer being of CoFe(B), wherein a graded transition layer of $CoFeAlO_x$ is formed between the CoFe(B) reference layer and the alumina tunnel barrier layer.

3. An apparatus, comprising:
an array of magnetic tunnel junction devices arranged along a tape bearing surface of a magnetic tape head module, each magnetic tunnel junction device having a reference layer, a free layer, and a tunnel barrier layer between the free and reference layers,
wherein the tunnel barrier layer of each magnetic tunnel junction device is primarily crystalline alumina,
wherein each tunnel barrier layer has a physical gradient in a degree of crystallinity that increases from a bottom to a top thereof, with the highest degree of crystallinity being at the top of the tunnel barrier layer,
wherein the tunnel barrier layer is formed on the reference layer, the reference layer being of CoFe, wherein a graded transition layer of $CoFeAlO_x$ is formed between the CoFe reference layer and the alumina tunnel barrier layer.

* * * * *